(12) United States Patent
Hutchinson et al.

(10) Patent No.: US 6,869,637 B2
(45) Date of Patent: Mar. 22, 2005

(54) BATH AND METHOD OF ELECTROLESS PLATING OF SILVER ON METAL SURFACES

(75) Inventors: Carl Hutchinson, Berlin (DE); Hartmut Mahlkow, Berlin (DE); Christian Sparing, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 10/362,087

(22) PCT Filed: Sep. 21, 2001

(86) PCT No.: PCT/EP01/11020

§ 371 (c)(1),
(2), (4) Date: Feb. 19, 2003

(87) PCT Pub. No.: WO02/29132

PCT Pub. Date: Apr. 11, 2002

(65) Prior Publication Data

US 2003/0157264 A1 Aug. 21, 2003

(30) Foreign Application Priority Data

Oct. 6, 2000 (DE) .......................................... 100 50 862

(51) Int. Cl.[7] .............................. B05D 7/14; B05D 7/24; C23C 18/54
(52) U.S. Cl. ........................ 427/96; 427/125; 427/436; 427/437; 106/1.14; 106/1.19; 106/1.23
(58) Field of Search .......................... 427/96, 436, 437, 427/125; 106/1.14, 1.19, 1.23

(56) References Cited

U.S. PATENT DOCUMENTS

| | | | | |
|---|---|---|---|---|
| 2,602,757 A | * | 7/1952 | Kantrowitz et al. | ........ 427/125 |
| 3,294,578 A | * | 12/1966 | Popeck | ........ 427/437 |
| 4,939,119 A | * | 7/1990 | Iwata et al. | ........ 505/401 |
| 5,871,896 A | * | 2/1999 | Royster et al. | ........ 430/569 |
| 5,955,141 A | * | 9/1999 | Soutar et al. | ........ 427/98 |
| 6,045,725 A | * | 4/2000 | Udaka et al. | ........ 252/586 |

FOREIGN PATENT DOCUMENTS

| | | |
|---|---|---|
| DE | 31 48330 A1 | 12/1981 |
| EP | 0 081 183 B1 | 5/1987 |
| EP | 0 797 380 A1 | 9/1997 |
| GB | 1022061 | 3/1966 |
| GB | 2 201 163 A | 8/1998 |
| JP | 05287542 A | 11/1993 |
| JP | 06240463 A | 8/1994 |
| JP | 09302476 A | 11/1997 |
| JP | 10130855 A | 5/1998 |
| SU | A-501116 | 1/1976 |
| WO | 96/17974 A1 | 6/1996 |
| WO | 96/17975 | 6/1996 |

OTHER PUBLICATIONS

XP–00218810, Journal of the Electrochemical Society pp. C28–C33 Electroless Silver Deposition in 100 nm Silicon Structures, 2001.
Derwent abstract 1976–84390X.
J. Electrochem. Soc. India (1976) vol. 16 Immersion and Electroless Plating of Silver Over Copper By S. Lakshminarasimhan and P.B. Mathur Central Electrochemical Research Institute, Karaikudi–3 (S. Rly.) pp. 85–89.
Inorganic Chemistry, F.A. Cotton and G. Wilkinson, pp. 987 and 988, no date provided.

* cited by examiner

*Primary Examiner*—Kirsten Jolley
(74) *Attorney, Agent, or Firm*—Paul & Paul

(57) ABSTRACT

Known methods of improving the solderability of copper surfaces on printed circuit boards present the disadvantage that outer layers of an irregular thickness are formed at the metal surfaces, that these layers are very expensive or that the constituents used in manufacturing them are harmful to the environment. Furthermore, the metal surfaces are to be suited to form bond connections as well as electrical contacts. To overcome these problems there are disclosed a bath and a method of electroless plating of silver by way of charge exchange reaction on surfaces of metals that are less noble than silver, more particularly on copper, that contain at least one silver halide complex and not containing any reducing agent for $Ag^+$ ions.

32 Claims, No Drawings

BATH AND METHOD OF ELECTROLESS PLATING OF SILVER ON METAL SURFACES

DESCRIPTION

The present invention relates to an electroless silver plating bath and to a method of electroless silver plating.

In the manufacture of printed circuit boards and other circuit carriers, at first a layer of copper is generally applied all over non-conductive surfaces of the substrates in order to render these surfaces conductive with this method. The non-conductive hole walls in the substrates are metal-coated. Then, circuit structures are formed at the surfaces of the substrate. Various methods may be utilized for this purpose. A commonly used method consists in first applying a mask generally formed with a photosensitive film onto the surfaces, said mask exclusively covering those regions of the surfaces in which no copper structures are to be formed, whereas those regions on the surfaces that correspond to circuit structures are kept bare. Then, a layer of copper is deposited in these regions by means of an electrolytic method, the thickness of said copper layer corresponding to the thickness of the circuit structure to be formed. Thereupon, another layer of metal, a layer of tin for example, serving as an etch protection, is applied electrolytically on the copper coating formed. Then, the mask is removed from the surfaces and the copper that has been laid bare in the regions that do not correspond to circuit structures is etched away. Finally, the layer of metal constituting the etch protection is removed as well, so that circuit structures are formed.

Up to the present, to electrically attach components, e.g., resistors, capacitors and semiconductor components, a layer of solder consisting of an alloy of tin and lead has been applied onto deoxidized copper surfaces using liquid solder. Then excess liquid solder is removed from the surfaces and more specifically from the holes by means of a hot air jet (air knife). This method has been known under the name of Hot Air Leveling Method (HAL method). Usually, the HAL method is carried out after a solder resist mask consisting of a polymer film has been applied onto the surfaces of the printed circuit boards with the exception of those regions in which the electrical components are to be soldered. As a result thereof, liquid solder is brought exclusively to those sites on the printed circuit boards at which the components are to be electrically contacted.

After the tin/lead coating has been formed, the components can be either surface mounted onto or contact leads of the components passed through the printed circuit board and be soldered there onto. Since the components are often mounted and soldered quite a long period of time after the circuit structures have been formed on printed circuit boards, the copper surfaces oxidize so that the wettability thereof with liquid solder is enormously reduced. As a result thereof, prior to soldering the circuit structures should first be freed from oxide layers that have formed. By forming the tin/lead coating on the circuit structures, the latter are prevented from oxidizing so that the components may be mounted and soldered later on without any problem. Accordingly, the layers produced with the HAL method also serve to protect copper surfaces from progressing oxidation. As a result thereof, solderability of areas that have been prepared with the HAL method is excellent. Moreover, the surfaces of the printed circuit boards resist oxidation and other corrosion processes.

Even though, in carrying out the HAL method, the thickness of the tin/lead coating can be equalized with the air knife, differences in the coating thickness on the surfaces of the printed circuit boards is still considerable. On account of the ever increasing density of the circuits and due to introduction of automatic assembly of the components, circuit structures formed must have surfaces as level as possible. This object cannot be achieved with the HAL technique. Also, the ever-smaller spacing between connecting points for the components (pads) leads to an increase in the formation of solder bridges. Alternative methods for replacing the HAL method have therefore been searched by means of which these drawbacks may be avoided. A primary objective consisted in precluding oxidation of the copper surfaces and in concurrently meeting the demands placed in connection with the ever-increasing miniaturization and the automation of the assembly.

These problems have been mitigated by forming a combined layer of nickel and gold. Since the circuit structures to be coated are generally electrically isolated with respect to one another, the two layers of metal are applied onto the copper surfaces by means of an electroless method. If an electroless plating method is utilized, regions of the copper surfaces to be coated need not be electrically connected to an external power source.

A nickel/gold finish is particularly suited for applications that place highest demands on quality. This finish is not only solderable but also bondable and provides excellent protection from corrosion. It may moreover be utilized to establish electrical contact areas, like in switches and plug contacts for example. However, this technique is very expensive so that the application thereof is restricted to high-quality circuits. It is not suited for low-end (mass) application.

Another high-quality finish is formed by electroless plating of palladium onto copper surfaces. A 0.2 $\mu$m thick layer of palladium yields best solderability. Moreover, thanks to a low contact resistance of this layer, palladium surfaces are also suited to establish contact areas on printed circuit boards. Since the price of palladium is high, it cannot be utilized in mass production though.

Formation of an organic protective coating of alkyl imidazoles or alkyl benzimidazoles on the copper areas is much more advantageous than a coating with a combined layer of nickel and gold or with palladium. These protective coatings provide efficient protection from tarnishing due to oxidation of the copper surfaces. Moreover these coatings are very thin so that disadvantages arising from an irregular coating thickness distribution as with HAL layers do not occur.

It is however disadvantageous that the organic protective coatings mentioned are not unrestrictedly suited to bond unhoused semiconductor components that are placed directly onto printed circuit boards. It is moreover not possible to solder once more a printed circuit board that has already been submitted to a soldering process, since the protective coating is destroyed during the first soldering procedure. Also, the advantage of a combined layer of nickel/gold and of a layer of palladium comprising the capability of forming electrical contact areas on the printed circuit boards cannot be realized with organic protective coatings.

In another alternative method the copper surfaces of the circuit structures are electroless tin plated by way of charge exchange reaction with copper. But like the organic protective coatings, the layers of tin only provide poor protection from tarnishing. Furthermore, they do not permit manufacturing multiple function surfaces as it is not possible to establish electrical contacts with tin surfaces. Layers of tin are solderable as they provide protection from tarnishing. However, multiple soldering steps can only be performed under certain limiting conditions. It is furthermore not possible to make contact layers for switches and plug contacts.

Known methods are utilized in accordance with the requirements to be met with. In manufacturing low-end printed circuit boards, a finishing layer formed is merely qualified for soldering applications for example. For this purpose, the HAL method will do. In the event high-quality printed circuit boards are to be manufactured which are to be suited for bonding applications and are to be provided with electrical contact areas as well, a combined nickel/gold finish or a palladium finish is applied.

A plurality of methods of manufacturing layers of silver on copper surfaces have been published:

J. Electrochem. Soc. India (1967), vol. 16, pages 85–89 compares various aqueous baths for forming tightly adherent and level layers of silver on copper surfaces. The baths contain ammonia, silver nitrate and sodium thiosulfate. An aqueous bath containing silver bromide, sodium thiosulfate and sodium hypophosphite was also tested. The layers deposited from these baths are indicated to rapidly tarnish and turn dark.

U.S. Pat. No. 3,294,578 discloses a method of electroless plating of silver onto non-noble metals, such as aluminum for example, in which a solution of a silver complex is employed the solution comprising nitrogen containing compounds acting as complexing agents. Among others, the complexing agents suggested are pyrrolidones, e.g. N-methyl pyrrolidone, amides, e.g. dimethyl formamide, anilines and amines.

EP 0 081 183 B1 furthermore discloses a method of electroless plating of layers of silver or gold onto surfaces of non-noble metals. In this method, a non-noble metal is contacted with a coating bath. The bath contains a metal complex that is obtainable by reaction of a monovalent silver or gold chloride with hydrochloric acid and with a basic substance capable of forming a complex with silver or gold. The complexing agents indicated more specifically are ammonium salts, amines, amino acids, amides, urea and the derivatives thereof, nitrogen heterocycles, alkaline phosphorus compounds as well as hydrocarbons, halogenated hydrocarbons, alcohols, ethers, ketones, esters, carboxylic acid nitriles and sulfur compounds. Among others copper is indicated for a substrate. As a silver ion source silver chloride was chosen. Appropriate solvents are organic solvents, more specifically aprotic solvents which are inert with regard to the complexing reaction, like for example carbon tetrachloride and particularly acetone.

WO 96/17974 A1 discloses a method of forming a silver coating on the surface of a metal, more specifically of coating the copper areas on the hole walls in printed circuit boards, copper being less electropositive than silver. For this purpose, the metal surfaces are contacted with an aqueous solution. The solution contains silver ions and a multidentate complexing agent and has a pH in the range of from 2 to 12. The complexing agents suggested are more specifically amino acids and the salts thereof, polycarboxylic acids, like for example nitrilotriacetic acid, ethylene diamine tetraacetic acid, diethylene triamine pentaacetic acid, N-hydroxyethyl-ethylene diamine tetraacetic acid and N,N,N',N'-tetrakis-(2-hydroxypropyl)-ethylene diamine, furthermore tartrates, citrates, gluconates and lactates, as well as compounds, like crown ethers and cryptands. Silver is deposited from these solutions by charge exchange reaction. Substantially, the solutions of preference do not contain halide ions.

WO 96/17975 discloses a method of silver plating copper surfaces on printed circuit boards, the method comprising first etching the copper surfaces, a lustrous, smooth surface being formed in the method, and then coating the surfaces with the help of a solution containing silver ions. The silver ions can be utilized in the form of the nitrate, acetate, sulfate, lactate or formiate salts thereof. Silver nitrate is preferably used. If need be, the plating solutions may additionally contain complexing agents, such as e.g. amino acids and the salts thereof, polycarboxylic acids, e.g. nitrilotriacetic acid, ethylene diamine tetraacetic acid, diethylene triamine pentaacetic acid, N-hydroxyethyl-ethylene diamine tetraacetic acid and N,N,N',N'-tetrakis-(2-hydroxypropyl)-ethylene diamine, furthermore tartrates, citrates, gluconates and lactates, as well as cyclic compounds, like crown ethers and cryptands.

EP 0 797 380 A1 discloses a method of improving the solderability of copper surfaces, especially of printed circuit boards, the method comprising applying a layer of silver to the surfaces by charge exchange reaction prior to soldering. The layer of silver is formed by contacting the surfaces with an acid plating solution that contains a silver imidazole complex. The silver ion source preferably used is silver nitrate.

Chemical Abstracts Plus 1995:240074 relating to JP-A-06240463 discloses a method of coating fine copper powder with silver the method comprising bringing the metal powder into contact with an aqueous plating solution that contains a silver complex salt formed by the reaction of a silver halide with a complexing agent for copper. Additionally, this solution preferably contains a sulfite acting as a stabilizer as well as a pH adjusting means.

JP 05/287542 A2 discloses an electroless silver plating bath that contains a silver ion complex as well as a reducing agent, such as e.g. hydrazine. As a consequence silver is not formed by a simple charge exchange reaction with a less noble metal but by reduction with the reducing agent. The silver ion complex used is a complex consisting of a silver halide compound and a complexing agent. The complexing agents used are for example anions of thiosulfate and of sulfite. The pH of the bath is adjusted by means of phosphate.

JP 09/302,476 A2 discloses an electroless bath for depositing a tin/silver alloy that contains, in addition to non-cyanide compounds of silver ions, non-cyanide tin(II) compounds. Among others bromides and iodides are utilized to stabilize silver ions.

Derwent Abstracts 1976-84390X relating to SU-A-501116 discloses a solution for depositing silver onto copper surfaces, said solution containing silver chloride, potassium ferrocyanide, potassium thiocyanate, sodium thiosulfate and ammonium hydroxide. The solution has a pH in the range of from 8 to 10. The solution is employed to coat finest circuit traces of copper on inorganic dielectric substrates.

Chemical Abstracts Plus 1998:314996 relating to JP-A-10130855 discloses non-cyanide silver plating baths that contain acid radicals and/or complexing agents for silver ions. The solutions serve to coat tin or tin alloys. Among others nitrates, sulfites, chlorides, bromides, iodides and thiosulfates are used to act as acid radicals or complexing agents, respectively.

In many of the methods described, known complexing agents for silver ions are used to guarantee serviceable deposition of silver onto copper. A great number of the complexing agents described are poorly biodegradable and accordingly are to be rated as having an impact on the environment. Furthermore the baths described in EP 0 081 183 B1 contain aprotic organic solvents and are therefore useless for modern manufacturing.

For the production of bulk goods like for example printed circuit boards, it is essential that ready-to-use plating solutions are to last without decomposing for several months, at least for several weeks. In many cases however, silver plating solutions proved not to be stable over a sufficiently long period of time. The plating solutions were observed to gradually darken due to silver deposition. Such solutions need to be replaced after a relatively short period of time in order to guarantee stable manufacturing conditions.

Therefore a main object of the present invention is to avoid the drawbacks of the known methods and silver plating solutions and more specifically to find a method and a bath of depositing silver by charge exchange reaction onto copper surfaces in particular, the method and bath being ecological and posing no safety hazards for the persons working with these baths. Most of all, the bath is to be stable without decomposing over a longer period of time. Another essential object consists in being capable of producing layers with good solderability on copper for example, the demands placed on solderability corresponding to those placed for their use in the printed circuit board technique.

The bath and the method in accordance with the invention serve to electroless plate silver by charge exchange reaction onto surfaces made of metals less noble than silver, more specifically to electroless plate silver by charge exchange reaction onto copper surfaces. This signifies that the bath preferably does not contain any reducing agent. In this case, silver is exclusively or at least mainly reduced by a charge exchange reaction with the metal to be coated. The silver ions contained in the bath, preferably silver(I) ions, are reduced to metallic silver, the metal to be plated being concurrently oxidized according to equation (I) and dissolved in the process. The metal surface to be coated is covered with a layer of silver until the silver coating on the metal surface presents neither gaps nor pores. As soon as this state is achieved, the metal surface to be coated is no longer contacted with silver ions so that the redox reaction ends.

The method according to the invention more particularly serves to form protective coatings of silver on copper surfaces on a substrate, especially copper surfaces on printed circuit boards, to subsequently carry out at least one process selected from the group, comprising a soldering process, a bonding process, a press-in technique and an electrical contacts forming method. The invention more specifically relates to the manufacturing of pure layers of silver.

The bath according to the invention contains at least one silver halide complex and does not contain any reducing agent for silver(I) ions ($Ag^+$). The silver halide complexes contained in the silver plating bath according to the invention are silver complexes of the type $Ag_nX_m^{(m-n)-}$, wherein n and m represent intergers and X is Cl, Br and I. In general n=1 and m=2, 3 or 4.

The method is perfectly suited to coat copper surfaces with a tightly adherent, lustrous layer of silver. The layer preferably has a thickness of approximately 0.2 $\mu$m. However, among others this value depends on the surface structure of the copper surfaces and on the composition of the bath in accordance with the invention. The rougher the copper surfaces, the thicker the layers of silver that can be formed. The layer has neither gaps nor pores and, as a result thereof, it is made certain that printed circuit boards treated in this way may be soldered and bonded without any problem and that the connecting leads of electrical components can be readily mechanically pressed into the holes in the printed circuit boards that have been contacted through. Additionally, printed circuit boards that have once been contacted with liquid solder can be soldered once more, for example in repairing the boards.

The boards provided with such layers of silver furthermore meet all the requirements that are customary in printed circuit board technique.

The inexpensiveness of coatings with silver is comparable to that of the tinning process. A silver finish deposited onto copper already meets many demands placed on a modern finishing layer even if coating thickness is small. More specifically, silver coatings cannot be used in soldering applications only but for bonding applications as well. Furthermore, these layers are provided with a very small contact resistance so that they may also be utilized for forming plug contacts at printed circuit boards and at switches.

The method of depositing silver on copper is based on the so-called charge exchange reaction according to equation (I):

$$Cu + 2Ag^+ \rightarrow Cu^{2+} + 2Ag \qquad (I)$$

The layer of silver can have a thickness of approximately 0.2 $\mu$m. It protects copper from oxidation. The silver surface moreover permits multiple soldering steps. The layers are level and are also suited for press-in technique by which connecting leads of electrical components are mechanically pressed into the holes of the printed circuit board so that electrical contact with circuit structures is established. Even after having submitted a printed circuit board provided with silver surfaces to vapour and heat for ageing the board, solderability results are comparable to those obtained with a classical HAL surface.

Furthermore demands relating to sufficient solder wetting are met with, even after ageing was carried out under various conditions (see Table 1). Moreover, the silver layers permit to generate electrical contact areas to manufacture switches and plug contacts. It is furthermore not necessary to utilize hard (poorly biodegradable) complexing agents for copper ions in order to avoid the drawbacks arising from an enrichment in $Cu^{2+}$ ions and consisting in that the layers of silver turn red in this case and very rapidly oxidize under the influence of heat and humidity.

The bath in accordance with the invention preferably does not contain any anion selected from the group, comprising nitrate, sulfite, thiosulfate and derivatives of these anions. Therefore the bath is extremely stable to decomposition so that it may be operated over a long period of time, over weeks or even months for example, without being replaced. Whereas known baths rapidly decompose to initially form a silver colloid and subsequently precipitate metallic silver, the baths according to the invention are extremely stable. The analysis of baths with known composition yielded that they decompose more specifically by light. Accordingly, the problem of decomposition could have been avoided or at least be mitigated by preventing the bath from being exposed, either completely or only to a small extent, to the influence of light. However, this is not readily possible when using conventional plants for treating printed circuit boards. Prevention of light exposure would in any event require very complicated constructional measures for encapsulating the bath liquid. As a result thereof, this measure does not represent an adequate solution to the problem arising here. The shelf life of the baths is only considerably prolonged by the fact that the plating bath according to the present invention contains neither nitrate, sulfite, thiosulfate nor derivatives of these compounds, like for example the acids and hemiacids of these compounds, such as bisulfite, and organic derivatives, like nitro compounds. The bath solutions in accordance with the invention are furthermore stable to oxygen originating from the air for example.

The bath according to the present invention is preferably aqueous. It may however also contain other solvents than water, like organic solvents for example. However, these solvents are to be avoided on account of their inflammability/ignition point and on account of the problems arising in connection with waste disposal.

The bath contains complex compounds of silver chloride, silver bromide and/or silver iodide acting as silver halide complexes. At least one silver bromide complex is preferably contained. These complexes are formed by the complexing of the corresponding silver(I) ions and halide ions by mixing a silver(I) salt in a solution with a halide salt for example. Depending on the molarity of the silver(I) ions compound and of the halide compound, complex anions form according to equation (II):

e.g.

$$AgX + nX^- \rightarrow AgX_{n+1}^{n-} \tag{II}$$

wherein the complex stability increases in the series Cl<Br<I. In the case of halide complexes, the complex anions that preferably form are $AgCl_2^-$ and $AgCl_3^{2-}$, in the case of the bromides, the complex anions that preferably form are $AgBr_2^-$ and $AgBr_3^{2-}$.

To produce the halide complexes, silver acetate, silver sulfate or silver methane sulfonate for example may be combined with the alkali halide or the alkaline-earth halide or with the halogen hydracids in a correct stoichiometric ratio (e.g. 1 mole $Ag^+$ for 2–3 moles halide) in an aqueous solution, complex anions thereby forming in the process. These anions preferably also form when the two species combined are not mixed in a stoichiometric ratio. The halide ion source is preferably utilized in excess. In most applications, concentration of silver ions in the bath is adjusted to approximately 1 g/l. The concentration of silver may range of from 0.1 to 20 g/l.

Stable silver plating baths in water are formed by employing silver halide complex compounds that are dissolved in excess alkali halide. In such a bath, the quantity of free silver ions ($Ag^+$) is driven back to such an extent that the charge exchange reaction between copper metal and silver ions causes stable, tightly adherent layers of silver to form. The baths are stable to acids so that the silver layers can be deposited even though the bath has been given a strongly acid pH. As a result thereof it is probable that transport of the copper ions away from the surface of the board is substantially facilitated so that only very weak complexing agents for copper are needed.

The pH of the bath is adjusted to a value in the range of from 0 to 6, preferably of from 2 to 3.0, using acids or bases as pH adjusting means, such as for example the halogen hydracids that correspond to the complex anions, viz. hydrochloric acid, hydrobromic acid and hydriodic acid. To shift the pH to a higher value it has to be made sure as far as possible that no base with a complexing constant for silver (I) ions is utilized which is greater than that of the silver(I) halides since in that case the corresponding silver complexes form with these complexing agents. Corresponding values for complexing constants for silver are indicated in: Critical Stability Constants, publ. Robert M. Smith and Arthur E. Martell, Plenum Press, New York and London.

Instead of or in addition to the halogen hydracids, the bath may contain other acids as well. In principle, all known mineral acids and/or organic acids as well as mixtures thereof are suitable, with the exception of those acids the anions of which are nitrate, sulfite, thiosulfate or derivatives thereof.

In order to make certain that the printed circuit boards can be contacted several times with liquid solder without thereby impairing solderability, the silver layers to be formed must be as free of gaps and pores as possible, since otherwise one single soldering procedure would already cause oxide films to form on the bare sites of the copper surfaces. In this case, solder wettability of the entire surface would be considerably impaired. Therefore, the silver layers deposited must usually be relatively thick in order to meet the requirements mentioned.

To guarantee as far as possible that even a layer of silver with a reduced thickness does not present any pores, the bath may contain at least one copper inhibitor in addition to the silver complex compounds. By selecting appropriate inhibitors, pores that still exist during the deposition of silver and that open toward the copper surface are closed. During charge exchange reaction, the redox process at pores may be facilitated by the fact that layers of inhibitors possibly selectively form on the remaining copper surfaces. As a result thereof, deposition takes place preferably at these sites. By employing such inhibitors, silver deposits on the copper surfaces can already very well resist oxidation by oxygen when the silver layers formed are not thick yet. As a result thereof, the required multiple solderability is readily achieved.

In an alternative and even preferred embodiment of the present invention the substrate is contacted with a post-treatment bath containing at least one copper inhibitor. Such a post-treatment bath can be applied after the substrate has been contacted with the silver plating bath. Under these conditions interference of the inhibitor with the silver plating process is prevented. On the other hand multiple soldering is achievable, possible since the inhibitor will block the surface regions on the base metal surface which are exposed to the post-treatment bath via pores and gaps. As a consequence oxidation of the base metals in these regions can no longer take place, so that solderability will be maintained even after the substrate has been soldered once.

The copper inhibitors which may be used both as a component in the silver plating bath or as a component in the post-treatment bath are preferably selected from the group, comprising triazoles, tetrazoles, imidazoles and pyrazoles. Benzotriazole and tolylbenzotriazole may for example be utilized.

Further inhibitors additionally permit to positively influence the appearance of the surface by leveling the layer of copper that had been roughened by the etching process. This permits to deposit lustrous layers of silver. By adding still other inhibitors to the silver plating bath it is also possible to produce water-repellent layers of silver. All the layers show very good solderability. This can be determined by means of a solder balance test.

In another preferred embodiment of the invention, the bath according to the invention additionally contains at least one complexing agent for copper(II) ($Cu^{2+}$) ions, like for example ethylene diamine, alanine diacetic acid, amino trimethyl phosphonic acid and 1-hydroxyethylene-1,1-diphosphonic acid.

By using copper complexing agents, formation of gaps and pores in the silver layer is reduced. The charge exchange reaction is probably impeded by the fact that particularly pores in the silver layer enrich with reaction products of copper dissolution due to charge exchange reaction. The copper complexing agent obviously serves to better solubilize $Cu^{2+}$ ions so that charge exchange reaction may proceed more easily.

The bath in accordance with the invention may additionally contain at least one surface-active agent, such as a polyglycolic ether or an alkyl amine polyglycolic ether for example.

To prepare the bath in accordance with the invention, the following steps may for example be performed:

First a silver salt is dissolved in water. Then the resulting solution is heated to accelerate formation of the complex anion. Thereafter an alkali halide and an aqueous halogen hydracid solution are added with stirring. At first, silver halide deposits thereby. This deposit however dissolves again as the halide continues to be added, the complex anion, which is soluble in aqueous solution, forming thereby.

Silver-deposits on copper-surfaces from the baths according to the invention already at temperatures lower than 20° C. The deposition rate depends on the temperature of the bath and on the silver ion concentration. The operating temperature is preferably adjusted to a value in the range of from 35 to 50° C.

The thickness required for the silver layer is reached in a very short time. A 0.1 to 0.6 µm thick silver layer is deposited within 1 to 5 minutes. For this reason, the bath according to the present invention is perfectly suited for horizontal production of printed circuit boards. The choice of the acid and of the pH also determine deposition speed.

To carry out the method in accordance with the invention an electroless silver plating bath containing at least one silver halide complex and not containing any reducing agent for $Ag^+$ ions is prepared and thereafter a substrate comprising metal surfaces to be coated are contacted with the electroless silver plating bath according to the invention. Usually, printed circuit boards are vertically hung and immersed into containers provided for this purpose the containers containing the processing fluid (dipping method). Alternatively, processing plants can be utilized in which the boards are held in a horizontal position and through which they are conveyed in a horizontal direction (horizontal technique). In this event, the processing fluid is delivered by nozzles (spray nozzles, injection nozzles, flow nozzles) to one or either side of the surfaces of the boards that are conveyed through the processing stations and guided by means of appropriate conveying elements (rolls, clamps). In horizontal plants, the boards may alternatively be conveyed in a vertical position along a horizontal transportation path.

Prior to coating the copper surfaces with silver, the copper surfaces are cleansed and roughened in order to improve adhesion of the silver layers to the substrate. An acid solution containing a surface-active agent may for example be used for cleansing. This is not absolutely necessary though if the boards were not subject to inappropriate handling prior to silver coating.

If need be, the boards are subsequently rinsed to remove remnants of cleansing fluid from the copper surfaces.

Then, the copper surfaces are roughened by means of a chemical etch solution. For this purpose, etch solutions that are customary in printed circuit board technique may be utilized, like for example an acid sodium peroxodisulfate solution or a cupric chloride etch solution. After treatment with the etch solution, the board is rinsed once more prior to contact with the silver bath.

Upon completion of silver coating the board is rinsed once more and then either post-treated with the post-treatment bath, afterwards rinsed and finally dried or directly dried without post-treatment.

The following examples serve to explain more explicitely the invention:

Preparation of parent solutions of silver halide complexes according to the invention:

EXAMPLE A 0.23 g silver acetate (solid) were added to a solution of 25 g sodium chloride and 3 ml 5 n hydrochloric acid in water. The volume of the solution obtained amounted to approximately 30 ml. Then, the solution was heated to 60° C. A deposit that first formed dissolved again. The concentration of the solution relating to $Ag^+$ ions amounted to 5 g/l.

EXAMPLE B 128 g sodium bromide were dissolved in 150 ml water and thereby heated to 60° C. Then, 1.45 g silver sulfate (solid) were added with stirring. Once the deposit had dissolved, the solution was mixed with 10 ml 5 n hydrochloric acid. Finally, the solution was filled up with water until 200 ml were reached. The concentration of the solution relating to $Ag^+$ ions amounted to 5 g/l.

Silver can be deposited in excellent quality from the thus prepared parent solutions onto previously cleansed copper areas and/or other less noble metals.

EXAMPLE 1

200 ml of a neutral solution of silver halide complexes containing 5 g/l of silver were added to a solution of 208 g sodium bromide in 800 ml of water. The clear solution was heated to 50° C. and was mixed with 10 ml 5 n hydrochloric acid.

A printed circuit board etched with an acid sodium peroxodisulfate solution was immersed for 3 min in this silver bath. A tightly adherent layer of silver with a coating thickness of 0.5 µm deposited onto the bare copper areas.

The silver plated copper areas were subsequently submitted to a solderability test. Solderability was excellent.

EXAMPLE 2

30 ml/l methane sulfonic acid was additionally admixed to a silver bath with a volume of 16 l prepared according to example 1. The bath was filled into a sprayer and the temperature of the bath was adjusted to 38° C.

Printed circuit boards with etched copper circuit traces were treated in the sprayer. Within one minute treatment time a 0.5 µm thick layer of silver was deposited onto the copper surfaces.

The tightly adherent layer of bright metallic silver showed excellent solderability. Even after the printed circuit board had been submitted to an ageing process for 4 hours, the quality of solderability was not reduced.

EXAMPLE 3

A surface-active agent (alkyl amine polyglycolic ether) was admixed (100 mg/l) to a silver plating bath prepared according to Example 1.

A previously normally etched copper plate was silver plated in said bath for 2 min at a temperature of 35° C. The layer of silver was bright, silvery and lustrous.

Even after 4 hours of ageing at 155° C. and after 4 hours of vapor treatment, the layer showed exceptional solderability.

EXAMPLE 4

0.03 mol/l ethylene diamine (copper complexing agent) was admixed to a silver bath prepared according to Example 2. The pH was adjusted to a value of 4.0. During the deposition of silver, copper was continuously dissolved so that the concentration of $Cu^{2+}$ in the bath continuously increased.

Even with a concentration of $Cu^{2+}$ of 1.0 g/l, the silver layers did not show any flaws. Such flaws, which consist in that the silver layers turned red and very rapidly oxidized under the influence of heat and humidity, usually occur when no complexing agent for $Cu^{2+}$ is used. The bright silvery layers showed good solderability.

EXAMPLE 5

0.05 mol/l 1-hydroxyethylene-1,1-diphosphonic acid were admixed to a silver bath prepared according to Example 2. The pH was adjusted to a value of 3.0.

Even upon achieving a concentration of $Cu^{2+}$ of 2.0 g/l, the silver layers did not show any flaws.

Even after having been submitted to an ageing process in the vapor test according to IEC 68-2-20 (4 h @ 98° C.–100° C.), the silver layer still showed good solderability.

EXAMPLE 6

1.0 g/l benzotriazole (copper inhibitor) was admixed to a silver bath prepared according to Example 5. Upon silver plating of printed circuit boards from this electrolyte at 35° C. for 2 min, solderability tests were performed with and without ageing.

All of the known tests (vapor test according to IEC 68-2-20 (4 h @ 98° C.–100° C.), dry heat according to IEC 68-2-2 (72 h @ 70° C., 96 h @ 100° C.), humidity according to IEC 68-2-3 (4 d (days), 10 d, 21 d, 56 d @ 40° C./93% relative humidity) and heat according to IEC 68-2-67 (168 h @ 85° C./85% relative humidity, alternatively 40° C./90% relative humidity) as well as migration tests according to IPC-TM-650 No. 2.6.14) were performed. Furthermore, solderability tests that are relevant for practical application were performed with a solder balance, by means of which the wetting force in the solder is measured, and assays for ascertaining the soldering behavior with reflow soldering and wave soldering were completed. The results were positive and met with all of the requirements of printed circuit board industry.

EXAMPLE 7

A mixture of 0.6 g/l benzotriazole and of 0.4 g/l tolyl-benzotriazole was admixed to a silver bath prepared according to Example 5. The pH was adjusted to a value of 2.0.

The layers of silver that deposited from said bath at 35° C. during a coating time of 2 min were very homogeneous and yielded excellent values in all of the solderability tests.

EXAMPLE 8

320 g sodium bromide and silver methanesulfonate at an amount equivalent to 1 g $Ag^+$ were dissolved in water to form 1 l of a clear solution. The pH of the solution was adjusted to 2.2 by means of methane sulfonic acid.

A printed circuit board pre-treated in accordance with the conditions given in Example 1 was coated with silver on the bare copper surfaces by contacting the board with the aforementioned silver plating solution at a temperature of 50° C. for 2 min. The board was then rinsed and dried.

A tightly adhering silver layer was formed. The thickness of the silver layer was determined using XRF (X-ray fluorescence). It amounted to 0.27 μm.

Thereafter the printed circuit board coated with the silver layer was subjected to a soldering test on a wave soldering plant in order to examine solderability of the pads and of the through holes of the board. All pads proved to be wetted with molted solder perfectly. The through holes were wetted and filled with solder completely (100%).

Thereafter the bath solution was put aside and not used for 3 months. During this time period the solution was exposed to light including sun light. After this time the bath solution still proved to be a clear solution without any precipitation. The silver concentration in the solution was still found to be 1 g/l.

A further printed circuit board was then prepared under the pre-treatment conditions given in Example 1. Then the board was silver coated in the aged plating solution using the same conditions as before. Thereafter the printed circuit board was rinsed and then dipped into a post-treatment solution containing a copper inhibitor and having a pH in the range of from 4.0 to 5.0. The board was treated in this solution at a bath temperature of 20 to 30° C. for 1 min.

Thereafter the board was rinsed and dried. The board was finally subjected to wave soldering. The same result was obtained as before: The thickness of the silver layer was the same as before and the same held true for the functioning of the silvering bath.

Although preferred embodiments of the invention are described herein in detail, it will be understood by those skilled in the art that variations may be made thereto within the scope of the appended claims. This includes that any combination of the features according to the present invention disclosed herein is incorporated as to be disclosed in this application as well.

TABLE

Ageing conditions to determine solderability.

| International standard | Description | Conditions | Duration |
| --- | --- | --- | --- |
| Internal Testing Conditions | dry heat | 155° C. | 4 h |
| IEC 68-2-2 | dry heat | 70° C., 100° C. | 72 h, 96 h |
| IEC 68-2-3 | high humidity | 40° C., 93% relative humidity | 4 d, 10 d, 21 d, 56 d |
| IEC 68-2-20 | vapor test | 98–100° C. | 4 h |
| IEC 68-2-67 | high temperature, high humidity | 85° C., 85% relative humidity | 24 h |
| IPC TM 650 No. 2.6.3.3 | Surface insulating resistance | 85° C., 85% relative humidity 45–50 volt d.c. | 168 h |

What is claimed is:

1. A method of electroless plating of silver onto metal surfaces by way of charge exchange reaction the metal of the metal surfaces being less noble than silver, the method comprising the following method steps:
   a. preparing an electroless silver plating bath containing at least one silver halide complex the ligands thereof being selected from the group consisting of halogen ions, and not containing any reducing agent for $Ag^+$ ions; and
   b. contacting a substrate provided with said metal surfaces with the electroless silver plating bath.
2. The method according to claim 1, wherein the silver halide complex is a silver bromide complex.

3. The method according to any one of claims 1 and 2, wherein the pH of the electroless silver plating bath is adjusted to a value in the range of from 0 to 6.

4. The method according to any one of claims 1 to 2, wherein the electroless silver plating bath does not contain any anion selected from the group consisting of nitrate, sulfite, thiosulfate and derivatives of these compounds.

5. The method according to any one of claims 1 to 2, wherein the method further comprises the method step of contacting the substrate with a post-treatment bath containing at least one copper inhibitor.

6. The method according to claim 5, wherein the at least one copper inhibitor is selected from the group, comprising triazoles, tetrazoles, imidazoles and pyrazoles.

7. The method according to any one of claims 1 to 2, wherein the electroless silver plating bath additionally contains at least one completing agent for $Cu^{2+}$ ions.

8. The method according to claim 7, wherein the at least one complexing agent for $Cu^{2+}$ ions is selected from the group consisting of ethylene diamine, alanine diacetic acid, amino trimethyl phosphonic acid and 1-hydroxyethylene-1,1-diphosphonic acid.

9. The method according to any one of claims 1 to 2, wherein the electroless silver plating bath additionally contains at least one surface-active agent.

10. The method according to any one of claims 1 to 2, wherein the metal surfaces comprise structures made from copper.

11. The method according to any one of claims 1 to 2, wherein electroless plating of silver on the metal surfaces comprises forming protective coatings of silver on copper surfaces on printed circuit boards and wherein at least one process selected from the group consisting of a soldering process, a bonding process, a press-in technique and an electrical contacts forming method, is subsequently carried out on the substrate.

12. The method according to claim 3, wherein the electroless silver plating bath does not contain any anion selected from the group consisting of nitrate, sulfite, thiosulfate and derivatives of these compounds.

13. The method according to claim 12, wherein the method further comprises the method step of contacting the substrate with a post-treatment bath containing at least one copper inhibitor.

14. The method according to claim 13, wherein the at least one copper inhibitor is selected from the group consisting of triazoles, tetrazoles, imidazoles and pyrazoles.

15. The method according to claim 14, wherein the electroless silver plating bath additionally contains at least one complexing agent for $Cu^{2+}$ ions.

16. The method according to claim 15, wherein the at least one complexing agent for $Cu^{2+}$ ions is selected from the group consisting of ethylene diamine, alanine diacetic acid, amino trimethyl phosphonic acid and 1-hydroxyethylene-1,1-diphosphonic acid.

17. The method according to claim 16, wherein the electroless silver plating bath additionally contains at least one surface-active agent.

18. The method according to claim 17, wherein the metal surfaces comprise structures made from copper.

19. The method according to claim 18, wherein electroless plating of silver on the metal surfaces comprises forming protective coatings of silver on copper surfaces on printed circuit boards and wherein at least one process selected from the group consisting of a soldering process, a bonding process, a press-in technique and an electrical contacts forming method, is subsequently carried out on the substrate.

20. A bath for electroless plating of silver onto metal surfaces being less noble than silver by way of charge exchange reaction, the bath containing at least one silver halide complex the ligands thereof being selected from the group consisting of halogen ions, and not containing any reducing agent for $Ag^+$ ions wherein the bath additionally contains at least one copper inhibitor.

21. The bath according to claim 20, wherein the silver halide complex is a silver bromide complex.

22. The bath according to any one of claims 21 and 20, wherein the pH of the bath is adjusted to a value in the range of from 0 to 6.

23. The bath according to any one of claims 21 and 20, wherein the bath does not contain any anion selected from the group consisting of nitrate, sulfite, thiosulfate and derivatives of these anions.

24. The bath according to claim 20, wherein the at least one copper inhibitor is selected from the group consisting of triazoles, tetrazoles, imidazoles and pyrazoles.

25. The bath according to any one of claims 21 and 20, wherein the bath additionally contains at least one complexing agent for $Cu^{2+}$ ions.

26. The bath according to claim 25, wherein the at least one complexing agent for $Cu^{2+}$ ions is selected from the group consisting of ethylene diamine, alanine diacetic acid, amino trimethyl phosphonic acid and 1-hydroxyethylene-1,1-diphosphonic acid.

27. The bath according to any of the previous claims 21 and 20, wherein the bath additionally contains at least one surface-active agent.

28. The bath according to claim 22, wherein the bath does not contain any anion selected from the group consisting of nitrate, sulfite, thiosulfate and derivatives of these anions.

29. The bath according to claim 28, wherein the at least one copper inhibitor is selected from the group consisting of triazoles, tetrazoles, imidazoles and pyrazoles.

30. The bath according to claim 29, wherein the bath additionally contains at least one complexing agent for $Cu^{2+}$ ions.

31. The bath according to claim 30, wherein the at least one complexing agent for $Cu^{2+}$ ions is selected from the group consisting of ethylene diamine, alanine diacetic acid, amino trimethyl phosphonic acid and 1-hydroxyethylene-1,1-diphosphonic acid.

32. The bath according to claim 31, wherein the bath additionally contains at least one surface-active agent.

* * * * *

UNITED STATES PATENT AND TRADEMARK OFFICE
CERTIFICATE OF CORRECTION

PATENT NO. : 6,869,637 B2
DATED : March 22, 2005
INVENTOR(S) : Hutchinson et al.

It is certified that error appears in the above-identified patent and that said Letters Patent is hereby corrected as shown below:

Column 13,
Line 13, replace "comprising" with -- consisting of --;
Line 17, replace "completing" with -- complexing --.

Signed and Sealed this

Thirteenth Day of September, 2005

JON W. DUDAS
*Director of the United States Patent and Trademark Office*